United States Patent [19]

Shidara et al.

[11] Patent Number: 4,463,279
[45] Date of Patent: Jul. 31, 1984

[54] DOPED PHOTOCONDUCTIVE FILM COMPRISING SELENIUM AND TELLURIUM

[75] Inventors: Keiichi Shidara, Tama; Kenkichi Tanioka; Teruo Uchida, both of Tokyo; Chushirou Kusano, Tokorozawa; Yukio Takasaki, Hachioji; Yasuhiko Nonaka; Eisuke Inoue, both of Mobara, all of Japan

[73] Assignees: Hitachi, Ltd.; Nippon Hoso Kyokai, both of Tokyo, Japan

[21] Appl. No.: 380,779

[22] Filed: May 21, 1982

[30] Foreign Application Priority Data

May 29, 1981 [JP] Japan .................................. 56-80914

[51] Int. Cl.$^3$ .......................... H01J 29/45; H01J 31/38
[52] U.S. Cl. .............................. 313/386; 252/62.3 S; 357/31; 357/32; 430/95; 313/94
[58] Field of Search ....................... 430/57, 95, 86, 61; 313/386; 357/31, 32; 252/62.3 S

[56] References Cited

U.S. PATENT DOCUMENTS 3,890,525  6/1975  Hirai et al. .......................... 313/386
4,330,773  5/1982  Shidara et al. ...................... 313/386

OTHER PUBLICATIONS

Chemical Abstracts vol. 95, col. 143052r.
Chemical Abstracts vol. 95 col. 178715m.

*Primary Examiner*—John D. Welsh
*Attorney, Agent, or Firm*—Antonelli, Terry & Wands

[57] ABSTRACT

A photoconductive film comprising a photo-conductive layer which is mainly made of selenium and a region added with tellurium in a direction of the thickness of the layer, wherein at least either one of a portion in a direction of hole flow of said region added with tellurium and a portion in the hole flow of another region which is located adjacent to said region added with tellurium is doped with at least one member selected from the group consisting of an oxide, a fluoride and elements which belong to the group II, III and VII, which are capable of forming a negative space charge in selenium, at a concentration in a range of 10 ppm to 1% by weight on an average. Typical examples of such oxide, fluoride and element include CuO, $In_2O_3$, $SeO_2$, $V_2O_5$, $MoO_3$, $WO_3$, $GaF_2$, $InF_3$, Zn, Ga, In, Cl, I, Br and the like. The after image characteristic ascribable to incident light of high intensity can be significantly improved.

15 Claims, 5 Drawing Figures

DOPED PHOTOCONDUCTIVE FILM COMPRISING SELENIUM AND TELLURIUM

The present invention relates generally to the structure of a photoconductive film used for a target of a photoconductive type image pickup tube, and more particularly to the structure of a rectifying contact type photoconductive layer which reduces a so-called afterimage phenomenon, brought about by incident light of high intensity, among photo-response characteristics of the photoconductive layer.

As is well known, amorphous selenium (Se) exhibits a photoconductive property and thus can be used for fabricating a photoconductive target of a photodiode type in combination with the use of signal electrodes of n-type conductivity. However, since selenium (Se) exhibits very poor sensitivity to long wavelengths of light, it is generally an accepted practice to add tellurium (Te) in a partial region of a selenium layer in the direction of the thickness thereof in an effort to improve the sensitivity to the long wavelength light, as is disclosed, for example, in Japanese Patent Application Laid-Open No. 24619/74 (corresponding to U.S. Pat. No. 3,890,525) or U.S. Pat. No. 4,040,985.

FIG. 1 schematically shows the basic structure of a typical one of the hitherto known targets. A typical example of the target implemented in this structure is disclosed in the U.S. Pat. No. 4,040,985. Referring to this figure, reference numeral 1 denotes a transparent substrate, 2 an n-type conductive transparent film, 3 a sensitized portion of a first p-type photoconductive film, 4 a layer for decreasing a storage capacitance of the target which is realized by a second p-type photoconductive film, and 5 a layer for aiding the landing of a scanning electron beam. The layer 3 is formed of an amorphous material containing Se, As (arsenic) and Te, while the layer 4 is formed of a composition containing Se and As and the layer 5 may be formed of $Sb_2S_3$ or the like. FIG. 2 illustrates, by way of example, a profile of the component distribution in the direction thicknesswise of the sensitized portion 3 of the first p-type photoconductive film in the target structure shown in FIG. 1. As can be seen from FIG. 2, tellurium (Te) serving for the sensitization is not present at all at a location of film thickness of zero corresponding to the interface with the electrically conductive transparent film 2 (i.e. at a region represented by a). Concentration of Te increases steeply starting from a location corresponding to a film thickness of 1000 Å and is distributed substantially uniformly over a region corresponding to a film thickness of 1500 Å (see a region represented by (b). Arsenic added or doped at the regions a and b is intended to serve for increasing thermal stability of Se. At a region c, arsenic (As) is added to form, as is believed, deep levels in selenium (Se). At this region c, concentration of As is decreased with a uniform gradient over the film thickness of 2500 Å. Arsenic (As) also serves for increasing the thermal stability of Se. With the structure of the target mentioned above, the aim of increasing the sensitivity to light of the long wavelengths is certainly accomplished, whereby those characteristics which are usually required for the image pickup tube in respect to the lag and after image are improved. However, the target still suffers a drawback that a long time is taken for the disappearance of the after image when the target has received incident light of high intensity as encountered in taking a picture of the sun, for example.

By the way, with the phrase "the normal use condition" of a photoconductive target employed in an image pickup tube, it is intended to mean the condition in which the target is used under a quantity of incident light which allows a signal current of the order of about 0.2 μA (peak-peak value) to be obtained as the output signal. On the other hand, the phrase "light of high intensity" is to mean the light intensity of about twenty times as high as that encountered in the normal use condition, although interpretation should not be made strictly of the above definitions which are given only for illustrative purposes to facilitate description of the invention.

An object of the present invention is to provide an improved photoconductive film which is formed of an amorphous material containing Se as a main component and in which the after image phenomenon due to light of high intensity is reduced.

According to the present invention, there is provided a photoconductive film comprising a photoconductive layer which is mainly made of selenium and a region added with tellurium in a direction of the thickness of the layer, wherein at least either one of a portion in a direction of hole flow of said region added with tellurium and a portion in the hole flow of another region which is located adjacent to the first mentioned region added with tellurium is doped with at least one member selected from a group consisting of an oxide, a fluoride and elements which belong to the group II, III and VII, which are capable of forming a negative space charge in selenium, at a concentration in a range of 10 ppm to 1% by weight on an average.

In an embodiment of the invention, the oxide which is capable of forming a negative space charge in selenium should preferably be at least one selected from the group consisting of $CuO$, $In_2O_3$, $SeO_2$, $V_2O_5$, $MoO_3$ and $WO_3$, while the fluoride capable of forming negative space charge in selenium should preferably be at least one selected from the group consisting of $GaF_3$ and $InF_3$. Further, the element which belongs to the group II, III or VII and is capable of forming a negative space charge in selenium should preferably be one selected from the group which consists of Zn, Ga, In, Cl, I and Br.

The invention is readily compatible with a hitherto known process of adding a photoconductive film containing selenium as a main component, with As, Bi, Sb, Ge, Si or the like for improving the photo response of the photoconductive film. In this case, at least a region of the photoconductive film located adjacent to the one added with tellurium and having an extension of 50 Å to 5000 Å in film thickness is added with a single or a plurality of elements selected from the group consisting of As, Bi, Sb, Ge and Si at a concentration in a range of 1% to 30% by weight on an average, wherein the potential built in the region of the photoconductive film has, of course to be adjusted.

Preferred embodiments of the present invention will now be described in conjunction with the accompanying drawings, in which:

FIG. 3 illustrates a photoconductive film according to the present invention having an improved profile of component distribution in a portion corresponding to that is denoted by reference numeral 3 in FIG. 1. In the following description, the ratio of the components is represented by ratio in weight (e.g. percent by weight) if there is described no substitutive representation.

Figure 1:
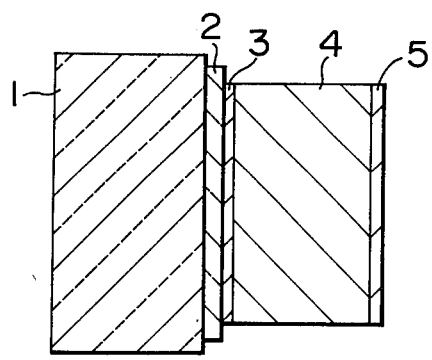
FIGS. 1 and 4 show basic structures of targets for use in an image pickup tube.
Figure 3:
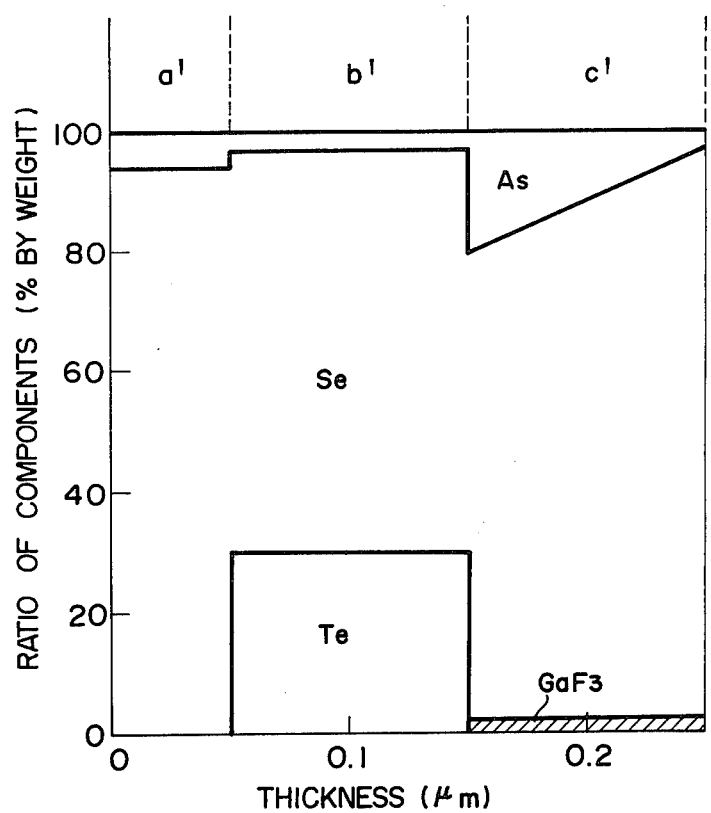
FIG. 3 is a graph illustrating, by way of example, a profile of the component distribution in a region of a photoconductive film realized according to an exemplary embodiment of the present invention.

The portion corresponding to that denoted by numeral 3 in FIG. 1 is constituted by an amorphous photoconductive layer made mainly of Se and has a local region added or doped with tellurium for sensitization. Referring to FIG. 3, portions a' and b' represent photosensitive layers which are adapted to absorb a major portion of light incident to the target to create carriers for conveying signal currents. A portion c' represents a sensitizing auxiliary layer, the role of which is to draw out photogenerated holes effectively from the portion b'.

Figure 2:
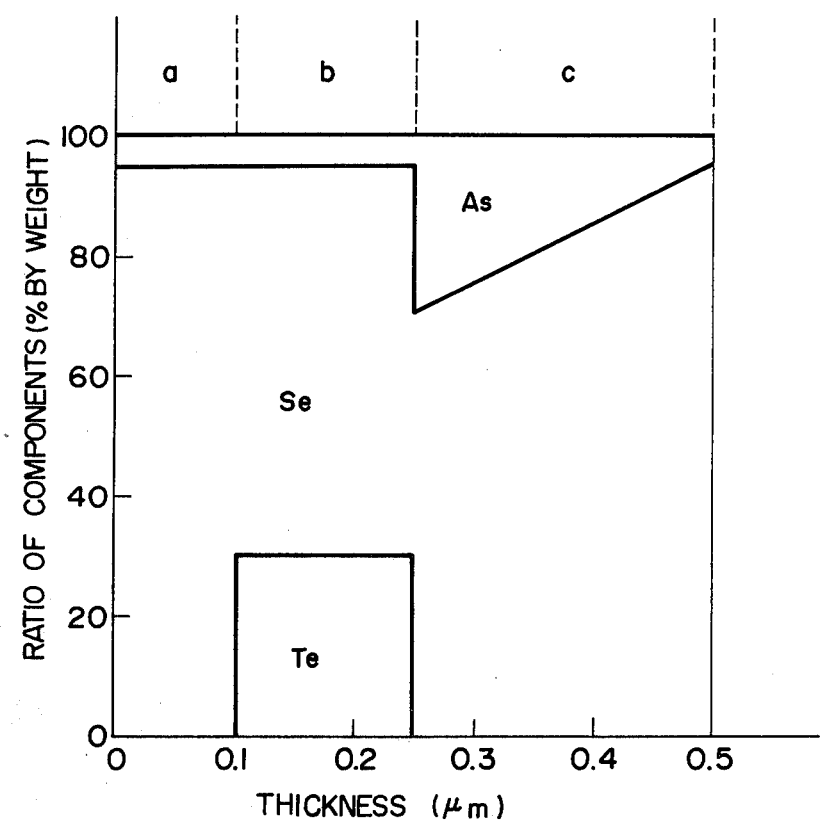
FIG. 2 is a graph illustrating, by way of example, a profile of the component distribution in a sensitized region of a hitherto known target for an image pickup tube.

In the case of the exemplary embodiment of the invention illustrated in FIG. 3, no trace of Te is present at a location of film thickness zero corresponding to the interface with the transparent conductive film (i.e. at the region a'). Concentration of Te increases steeply starting from a location corresponding to the film thickness of 500 Å and Te is added at concentration 30% over a contiguous region corresponding to the film thickness of 1000 Å (region b'). On the other hand, arsenic (As) is distributed uniformly in the direction of the thickness of the film over regions a' and b' at concentrations of 6% and 3%, respectively. The structures of the portions or regions a' and b' are in principle the same as the corresponding regions a and b shown in FIG. 2. A typical structure of this variety of p-type conductive film is composed of a first p-type conductive layer and a second p-type conductive layer. More specifically, the first p-type conductive layer 3 comprises, in the order as viewed from the transparent conductive layer (electrode), a first region a' (FIG. 3) mainly made of Se and having a thickness greater than 100 Å, to which at least one member selected from the group consisting of Te and additive elements capable of forming a deep level in Se is added, the quantities of Te and the additive elements being, respectively, of a concentration not more than 20 atomic % on an average; a second region b' (FIG. 3) mainly made of Se and having a thickness ranging from 200 Å to 5000 Å in which the peak of continuous distribution of concentration of added Te is not less than 15 atomic %; and a third region c' (FIG. 3) which is mainly formed of Se and having a thickness in a range of 500 Å to 3000 Å in which the additive element capable of forming deep levels in Se has a peak of concentration of more than 20 atomic %. At least one element capable of forming the deep levels in Se is selected from the group consisting of As, Sb, Bi, Ge and a mixture thereof. It is in respect to the region c' (i.e. the layer for enhancing the sensitization) that the photoconductive film according to the present invention differs from the one shown in FIG. 2. The region c' shown in FIG. 3 has a thickness of 1000 Å. In this region c', the concentration of added As is 20% at the beginning of the region and decreased smoothly as the thickness is increased. At the end of the region c', the concentration of As is reduced down to 3%. It should be noted that $GaF_3$ is distributed uniformly in the direction of the thickness of the film at a concentration of 2000 ppm. In the case of the exemplary embodiment being now described, it is important to note that the region c' is doped with $GaF_3$.

Although $GaF_3$ is distributed over the whole region c' uniformly in the direction of the thickness of the film at the constant concentration in the case of the illustrated embodiment, it may also be distributed non-uniformly with a certain gradient of concentration. Further, $GaF_3$ may be distributed only at a portion of the region c'. For example, $GaF_3$ may present at a portion of the region b' in the vicinity of the interface with the region c' or at a portion of the region 4 shown in FIG. 1 in the vicinity of the interface with the region c'. The effect ascribable to the doping of $GaF_3$ can be recognized even in the case where $GaF_3$ is doped to a region distanced toward the region c' by 1 μm from the region doped with Te. In the case of doping the region b', the effect can be recognized where $GaF_3$ is doped to a region by a half width of the region b' from the sensitizing auxiliary layer c'. Further, although it has been mentioned that the concentration of As is descreased smoothly in the case of the illustrative embodiment, the concentration of As may be either uniform or varied steeply as viewed in the direction of the thickness of the photoconductive film. Besides, arsenic (As) may be spared when the quantity of doped $GaF_3$ is correspondingly increased. However, it is desirable in practice to add at least 5% by weight of As with a view to enhancing the stability in consideration of the fact that As is effective for preventing diffusion of Te. What is necessary is to dope $GaF_3$ at the region c' or portions thereof located in the vicinity of the interfaces with the regions or layers adjacent to the region c'.

It should be appreciated that the present invention is not restricted to the typical example described above or modifications thereof but can be advantageously applied to other photoconductive films mainly made of Se and doped with Te.

The second photoconductive layer or film (corresponding to that denoted by numeral 4 in FIG. 1) can be realized through application of the hitherto known composition. The typical embodiment of the second p-type conductive layer is mainly made of Se and added with at least one member selected from the group consisting of Te and additive elements capable of forming deep levels in Se, wherein the quantities of Te and the additive elements, respectively, are so selected as not to be more than 15 atomic % on an average.

It should be pointed out that oxides, fluorides and the elements taught by the invention may be doped at a portion of the region added with Te or a portion or portions of the region located at interfaces with other layers, whereby the intended effect can equally be attained. When they are doped in the whole photoconductive film or in the p-type conductive layer 4 shown in FIG. 1, no intended effect can be attained.

A method of improving the after image phenomenon ascribable to incident light of high intensity has been already proposed, according to which the regions a' and/or b' where a major part of the signal current is created is doped with fluorides capable of forming shallow levels, e.g. at least one component selected from a group consisting of LiF, NaF, $MgF_2$, $CaF_2$, $AlF_3$, $CrF_3$, $MnF_3$, $CoF_2$, $PbF_2$, $BaF_2$, $CeF_3$, and TlF. Reference is to be made to U.S. patent application Ser. No. 152,291 filled on May 22, 1980. When the invention is carried out in combination with the method mentioned above, the improvement of the after image phenomenon due to incident light of the high intensity as contemplated by the present invention can further be enhanced without impairing the high light sticking effect involved by the known technique.

It should be mentioned that the quantity of doped fluorides described above is in a range of 50 ppm to 5% on an average.

In the following examples, structures of the photoconductive film according to the invention will be elucidated in more detail.

EXAMPLE 1

Description will be made with the aid of FIG. 1. A transparent conductive film 2 mainly made of tin oxide is formed on a glass substrate 1. Selenium is deposited on the film 2 through evaporation in thickness of 100 Å to 500 Å to thereby form a first layer. Subsequently, Se, Te and $MoO_3$ are deposited thereon from respective evaporation sources to thereby form a second layer having a thickness of 500 Å to 1000 Å. In this case, Te is uniformly distributed thickneswise at a concentration in a range of 25 to 35%, while $MoO_3$ is by controlling evaporation time and/or current supplied to its evaporative source at a concentration of 2000 ppm only in a region located adjacent to the surface of the second layer (i.e. the region located adjacent to a third region mentioned below) and having a thickness of 200 Å. Next, Se and $MoO_3$ are simultaneously deposited through evaporation from respectively provided evaporation sources to thereby form a third layer having a thickness of 200 Å and doped with $MoO_3$ at a concentration of 2000 ppm. Formed on the third layer is a fourth layer of Se deposited through evaporation in thickness of 4 μm. Evaporation to form the first to the fourth layer mentioned above are effected under vacuum of $2 \times 10^{-6}$ Torr. Finally, $Sb_2S_3$ is deposited on the fourth layer through evaporation in the atmosphere of argon at a pressure of $2 \times 10^{-1}$ Torr to form a layer 5 of 1000 Å thickness, which layer 5 is to serve for aiding the landing of electron beam. It should be noted that the aforementioned first photoconductive film partially added with Te for sensitization is constituted by the first to the third layers mentioned above, while the fourth layer mentioned above corresponds to the second photoconductive film described hereinbefore, wherein the first photoconductive film corresponds to that denoted by numeral 3 in FIG. 1 and the second photoconductive film corresponds to that denoted by 4 in the same figure. These corresponding relationships between the first to the fourth layers and the first and the second photoconductive films also hold true in the case of other examples described hereinafter. The image pickup characteristics of the structure thus obtained were measured. It has been found that the after image characteristic is significantly improved. In this connection, it has also been ascertained that crystallization of Se can be prevented by adding the first through the fourth layers inclusive with As or Ge at concentration not more than 10%, whereby thermal stability of the structure can be assured. Further, it has also been found that replacement of $MoO_3$ by CuO, $In_2O_3$, $SeO_2$, $V_2O_5$, $WO_3$ or $GaF_3$, $InF_3$ or Zn, Ga, In, Cl, I, Br or the like will bring about the desired effect. The first photoconductive film may also be doped with two or more dopants selected from the above group.

EXAMPLE 2

Figure 4:
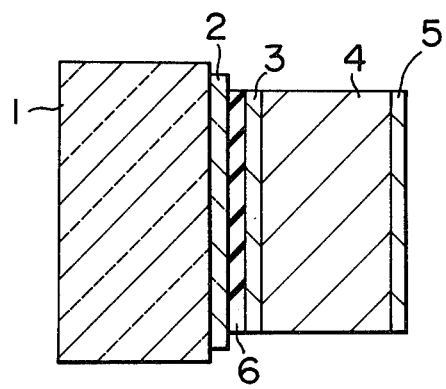

Reference is made to FIG. 4. A transparent conductive layer 2 mainly made of tin oxide is formed on a glass substrate 1. A rectifying contact layer 6 is formed on the transparent conductive layer 2 by depositing thereon $GeO_2$ in a thickness of 200 Å and $CeO_2$ in a thickness 200 Å through evaporation under vacuum of $3 \times 10^{-6}$ Torr. Next, Se and $As_2Se_3$ are deposited through evaporation from respective evaporation sources in a thickness of 100 to 500 Å to thereby form the first layer. At that time, As is added at a concentration of 3% uniformly in the direction of the thickness of the first layer. Subsequently, Se, $As_2Se_3$ and Te are deposited through evaporation from respective sources to thereby form the second layer having a thickness of 500 to 1000 Å. At that time, Te is uniformly distributed thicknesswise at a concentration of 25 to 35%, while As is uniformly distributed thicknesswise at a concentration of 2%. The third layer of Se, As and $GaF_3$ is formed in a thickness of 400 Å to 1000 Å on the second layer through simultaneous evaporation from respective sources. At that time, current supplied to the evaporation source for $As_2Se_3$ is so controlled that concentration of As is at first in a range of 20 to 25% and decreased, as evaporation proceeds, to be 3% at the end of deposition of the third layer. On the other hand, $GaF_3$ is uniformly distributed at a concentration of 1000 ppm over a thickness of 200 Å from the beginning of deposition of the third layer. The first to third layers thus formed constitute the first photoconductive film denoted by numeral 3 in FIG. 4, as in the case of the Example 1. The fourth layer 4 is formed on the third layer by simultaneously depositing thereon Se and $As_2Se_3$ through evaporation so that the overall film thickness is of 4 μm. At that time, As is uniformly distributed at a concentration of 3% in the direction of the thickness of the layer. Evaporation for forming the first to fourth layers is effected under vacuum of $2 \times 10^{-6}$ Torr. Finally, the electron beam landing layer 5 of 1000 Å thickness is formed through evaporation of $Sb_2S_3$ in the atmosphere of argon at a pressure of $2 \times 10^{-1}$ Torr. In the structure thus realized, both As and $GaF_3$ are coexistent in the third layer. It has been ascertained that this structure is equally effective for improving the after image characteristic.

EXAMPLE 3

This example is directed to the structure in which the third layer is not only uniformly doped with $GaF_3$ but also uniformly distributed with As.

A transparent conductive layer 2 mainly made of tin oxide is formed on a glass plate 1. Next, the first layer is formed on the transparent conductive layer 2 by evaporating Se and $As_2Se_3$ from respective evaporation sources in a thickness of 300 Å, wherein As is uniformly distributed thicknesswise at a concentration of 3%. Subsequently, Se, $As_2Se_3$ and Te are simultaneously deposited on the first layer through evaporation from the respective sources to thereby form the second layer in a thickness of 500 Å, wherein Te and As are uniformly distributed in the direction of the thickness of the layer at concentrations of 35% and 2%, respectively. The third layer is formed on the second layer by depositing thereon Se, As and $GaF_3$ through simultaneous evaporation from the separate sources containing Se, $As_2Se_3$ and $GaF_3$, respectively. The third layer is 200 Å thick, in which As is uniformly distributed of the thickness at a concentration of 25% with GaF$_3$ also being uniformly distributed thicknesswise at a concentration of 2000 ppm. Next, the fourth layer of Se and As is formed through evaporation so that the overall film thickness is 6 μm, wherein As is uniformly distributed thicknesswise at a concentration of 2%. Evaporation for forming the first to fourth layers is effected under vacuum of $2\times10^{-6}$ Torr. Finally, Sb$_2$S$_3$ is deposited on the fourth layer in the atmosphere of argon at $2\times10^{-1}$ Torr to form the layer 5 of 1000 Å thickness.

It has been ascertained that improvement of the after image characteristic can be equally attained when GaF$_3$ to be doped in the third layer is replaced by materials listed in the following table 1.

TABLE 1

| Materials | Concentrations (ppm) |
| --- | --- |
| MoO$_3$ | 2000 |
| CuO | 3000 |
| In$_2$O$_3$ | 1000 |
| SeO$_2$ | 200 |
| V$_2$O$_5$ | 500 |
| WO$_3$ | 2500 |
| InF$_3$ | 1000 |
| Zn | 1000 |
| Ga | 700 |
| In | 600 |
| Cl* | 200 |
| I* | 300 |
| B$_1$* | 500 |

*Halogens are doped by using syntheses of Se and selenium-halides.

In case the concentration of As in the third layer is extremely low or extremely high, the sensitivity as well as variation thereof during operation which are important characteristics required for the photoconductive film undergoes degradation, as can be seen from the table 2 mentioned below. It is thus important to note that the concentration of As in the third layer has to be in a range of 1% by weight to 30% by weight on an average.

TABLE 2

| Concentration of GaF$_3$ | Concentration of As in third layer | Sensitivity to light of 10 lx | Changes in sensitivity during operation | Remarks |
| --- | --- | --- | --- | --- |
| 2000 ppm | 35% by weight | 250 nA | +10% | bad |
| | 1–30% by weight | 200 nA | ±0% | good |
| | 0.5% by weight | 70 nA | −8% | bad |

EXAMPLE 4

This example is directed to a structure of the photoconductive film in which the third layer is partially doped with a predetermined oxide.

A transparent conductive film mainly made of In$_2$O$_3$ is formed on a glass substrate, which is followed by evaporation of CeO$_2$ under vacuum of $3\times10^{-6}$ Torr to form the rectifying contact layer having a thickness of 300 Å. Next, Se and As$_2$Se$_3$ are concurrently deposited on the rectifying contact layer through evaporation from respective evaporation sources to form the first layer of 300 Å which is to constitute the sensitizing portion of the p-type photoconductive film. At that time, As is uniformly added thicknesswise at a concentration of 12%. Subsequently, Se, As$_2$Se$_3$ and Te are deposited through evaporation from the respective evaporation sources to form the second layer having a thickness of 600 Å. At that time, Te and As are uniformly distributed thicknesswise at concentrations of 30% and 3%, respectively. The first and the second layers constitute the sensitizing layers. Subsequently, Se, As and In$_2$O$_3$ are deposited through evaporation on the second layer to form the third layer which is to serve as the auxiliary sensitizing layer. In formation of the third layer, Se and As$_2$Se$_3$ are evaporated from respective evaporation sources to form the third layer of 100 Å thickness. At that time, As is uniformly distributed thicknesswise at a concentration of 25%. Next, Se, As$_2$Se$_3$ and In$_2$O$_3$ are deposited in thickness of 100 Å through evaporation from respective evaporation sources. At that time, As is uniformly distributed thicknesswise at a concentration of 2%, while In$_2$O$_3$ is uniformly distributed thicknesswise at a concentration of 700 ppm. When the third layer has thus been finished, the fourth layer is formed thereon by simultaneously depositing Se and As$_2$Se$_3$ through evaporation from respective evaporation sources so that the overall thickness of the first to the fourth layers is 5 μm. In the fourth layer, As is uniformly distributed thicknesswise at a concentration of 2%. Evaporation for forming the first to the fourth layers is effected under vacuum of $3\times10^{-6}$ Torr. Finally, Sb$_2$S$_3$ is deposited on the fourth layer in thickness of 1000 Å in the atmosphere of argon at $2\times10^{-1}$ Torr.

EXAMPLE 5

This example is directed to a structure of the photoconductive film in which a preselected oxide is doped in a portion of the thid layer where As is distributed in a step-like profile.

A transparent conductive layer mainly made of tin oxide is formed on a glass plate and subsequently CeO$_2$ is deposited through evaporation on the transparent conductive layer to form a rectifying contact layer of 200 Å thick. The evaporation is effected under vacuum of $2\times10^{-6}$ Torr. Subsequently, a first layer is formed in thickness of 500 Å by depositing Se and As$_2$Se$_3$ through evaporation from respective evaporation sources. At that time, As is uniformly distributed thicknesswise at a concentration of 6%. Then, a second layer of Se, Te and As is formed in thickness of 600 Å on the first layer through evaporation, wherein Te and As are uniformly distributed thicknesswise at concentrations of 30% and 3%, respectively. Next, a third layer of Se, As and In$_2$O$_3$ is formed on the second layer through evaporation in accordance with the procedure mentioned below. At first, Se and As$_2$Se$_3$ are deposited in thickness of 120 Å through simultaneous evaporation from the respective evaporation sources, wherein As is uniformly distributed thicknesswise at a concentration of 25%. Subsequently, Se and As$_2$Se$_3$ are deposited in thickness of 800 Å through evaporation from respective sources. At this time, As is uniformly distributed thicknesswise at a concentration of 3%. Further, Se, As$_2$Se$_3$ and In$_2$O$_3$ are deposited at a thickness of 120 Å through evaporation from respective sources. At this time, As and In$_2$O$_3$ are uniformly distributed thicknesswise at concentrations of 3% and 1000 ppm, respectively. Thus, the third layer has been finished. Next, a fourth layer of Se and As is formed on the third layer through evaporation of Se and As$_2$Se$_3$ from respective sources in such thickness that the overall thickness of the first to the fourth layer amounts to 6 μm. In the fourth layer, As is uniformly distributed thicknesswise at a concentration of 2%. Evaporation for forming the first to the fourth layer is carried out under vacuum of $2\times10^{-6}$ Torr. Finally, the electron beam landing support layer is formed in thickness of 1000 Å by depositing $Sb_2S_3$ on the fourth layer through evaporation in the atmosphere of argon at $2\times10^{-1}$ Torr.

EXAMPLE 6

This example is directed to a structure of the photoconductive film in which the third layer is doped with a preselected oxide and in which As as doped is distributed in a step-like profile.

A transparent conductive layer mainly made of indium oxide is formed on a glass substrate. An auxiliary layer for the rectifying contact is formed on the transparent conductive layer by depositing sequentially $GeO_2$ and $CeO_2$ in a thickness of 200 Å, respectively, through evaporation under vacuum of $3\times10^{-6}$ Torr. Subsequently, a first layer constituting a part of the sensitizing portion of the p-type photoconductive film is formed in thickness of 300 Å on the rectifying contact layer by depositing thereon Se and $As_2Se_3$ through evaporation from respectively provided evaporation sources, wherein As is so distributed that concentration thereof is 3% at a region located between the sub-layer of $CeO_2$ and the center plane of the first layer while concentration of As distributed in the remaining portion of the first layer is 20%. Next, a second layer is formed on the first layer in a thickness of 600 Å by depositing thereon Se and Te through evaporation from respective evaporation sources provided separately, with concentration of Te being 30%. Subsequently, the third layer is formed on the second layer in a thickness of 300 Å by depositing Se and $As_2Se_3$ through evaporation of respective sources. In a third layer, As is distributed at a concentration of 20% at a region extending from the interface with the second layer for a distance 100 Å and at a concentration of 2% in the remaining portion having a thickness of 200 Å. On the other hand, $In_2O_3$ is uniformly distributed at a concentration of 500 ppm throughout the third layer. Then, a forth layer is formed on the third layer by depositing thereon Se and $As_2Se_3$ in a thickness of 6 μm through simultaneous evaporation from respective evaporation sources. Concentration of As in this fourth layer is 2%. Evaporation of the first to the fourth layers is carried out under vacuum of $2\times10^{-6}$ Torr. Finally, $Sb_2S_3$ is deposited on the fourth layer in a thickness of 1000 Å in the atmosphere of argon at $2\times10^{-1}$ Torr.

It has been found that similar improvement of the after image characteristic of the photoconductive film can be attained in the case where $In_2O_3$ doped in the third layer is replaced by dopants selected from materials listed in table 3 mentioned below. In the examples summarized in the table 3, both dopants listed at columns labelled with "dopant 1" and "dopant 2" are used in combination.

TABLE 3

| | Dopant 1 | | Dopant 2 | |
|---|---|---|---|---|
| | Materials | Added Quantities (ppm) | Materials | Added Quantities (ppm) |
| 1 | $V_2O_5$ | 200 | $GaF_3$ | 500 |
| 2 | $In_2O_3$ | 1000 | $WO_3$ | 1000 |
| 3 | $GaF_3$ | 300 | $InF_3$ | 700 |
| 4* | Cl | 200 | In | 300 |

*Halogen is doped by using synthesis of Se and selenium-halide.

In the foregoing description of the exemplary embodiments and the examples for elucidating the invention, it is assumed that As is added to form deep levels in Se. However, it should be appreciated that one of Sb, Bi, Si and Ge may be used singly or in combination with As to the substantially same effect.

In conjunction with the photoconductive films illustrated in the Examples described above, it should further be added that the whole or part of the sensitizing portion (the first and the second layer) may be doped with at least a member selected from the group of fluorides consisting of LiF, NaF, $MgF_2$, $CaF_2$, $AlF_3$, $CrF_3$, $MnF_2$, $CoF_2$, $PbF_2$, $BaF_2$ and $CeF_3$ for forming shallow levels in Se. In that case, the aimed effect of mitigating the after image produced due to the pickup of light of high intensity such as solar rays can further be improved without imparing the effect of diminishing the highlight sticking phenomenon involved by the doping of fluorides, as described hereinbefore.

The structures of the photoconductive film taught by the present invention are not only effective to reduce the after image phenomenon brought about by incident light of high intensity but also make it possible to mitigate the after image which is produced, for example, after a stationary or still image is picked up for a long duration.

Although the physical mechanism through which the after image phenomenon occurs after the illumination by light of high intensity is significantly mitigated by adopting the novel structure of the photoconductive film proposed by the invention has not yet been fully brought to the light, it is believed to be explained by the fact that time constant of changes or variations in space charge produced in the sensitizing auxiliary layers is rendered much smaller by doping additionally those materials which are capable of forming a negative space charge in Se according to the teaching of the invention, as compared with the case where the only material that is capable of forming the deep levels in Se is added.

Figure 5:
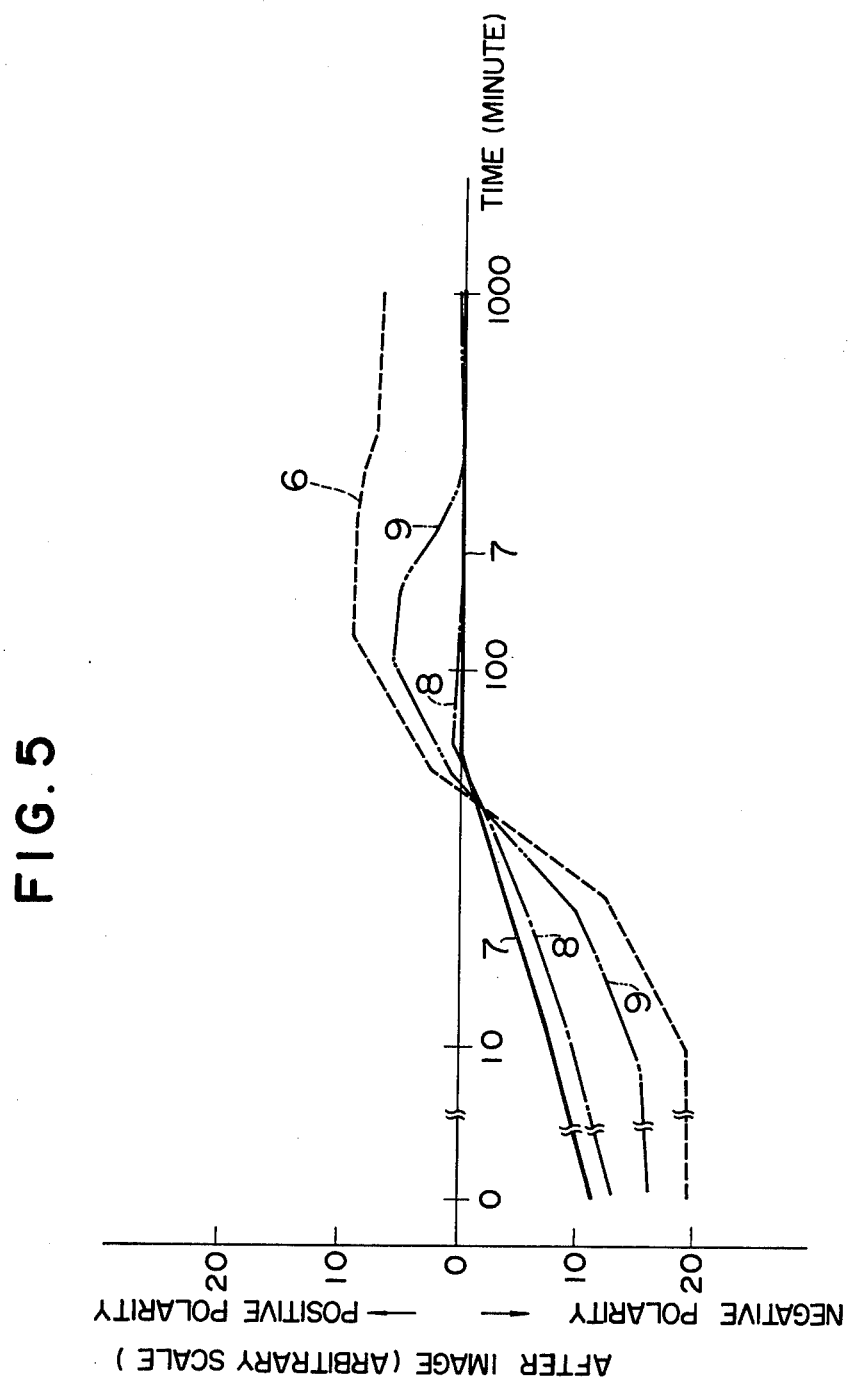
FIG. 5 is a graph illustrating the manner in which after images brought about by incident light of high intensity undergo changes or decays with time.

FIG. 5 shows experimentally obtained decay curves of the after images brought about by exposure to light of high intensity which corresponds to the light intensity encountered on the usual use condition multiplied by a factor of ca. 500,000. In this graph, the time lapse after the cut-off of the high intensity incident light is taken along the abscissa, while the intensity of the after image is taken along the ordinate in terms of ratio to the signal current produced in operation on the usual use condition. In this connection, when the sensitivity of a portion receiving light of the high intensity is temporarily increased, it is said that the portion exhibits a sensitivity of positive polarity (or produces an after image of positive polarity), while it is said that the portion has a sensitivity of negative polarity when the sensitivity is temporarily decreased upon illumination with light of the high intensity. The concrete structure of the sensitized photoconductive film as used in the experiment corresponds to the one described hereinbefore in conjunction with the Example 4. In FIG. 5, a broken line curve 6 represents the decay curve as obtained in a hitherto known target formed of the photoconductive film containing no $In_2O_3$, while a solid line curve 7 and a single-dotted curve 8 represent the decay characteristic curves obtained in the target formed of the photoconductive film according to the invention (corresponding to the one disclosed in the aforementioned Example 4). In the case represented by the broken line curve 6, it can be seen that the sensitivity of the hitherto known target is temporarily decreased upon illumination of light of the high intensity to produce the after image of negative polarity which is invented, after lapse of about 40 minutes, into the after image of positive polarity having a long decay time. In contrast, in the case of the photoconductive film according to the invention, both the intensity of the after image and the decay time are significantly improved, as can be seen from the solid line curve 7 and the single-dotted line curve 8.

The effect attained by the structure of the photoconductive film according to the invention is due to the doping of providing a the proposed material capable of negative space charge in Se, which doping additionally allows the quantity of material added for forming the deep levels to be decreased. The aimed effect or action does not make significant appearance when the doping quantity of the material doped for forming the negative space charge according to the invention is so small as on the order of less than 10 ppm on an average, whereby the after image characteristic approximates to the decay curve 6 shown in FIG. 5. On the other hand, when the doping quantity is excessively large, space charge tends to be likely to vary, involving deterioration of the characteristics such as variation in the signal current and the like to disadvantage. When the doping quantity of the proposed dopant materials is not less than 1% on an average, such an after image characteristic as represented by a double-dotted line curve 9 is shown in FIG. 5. As can be seen, although the improvement is observed on the decay time of the after image, the intensity thereof remains to be improved. Accordingly, it can be generally said that the concentration of the proposed dopants for forming the negative space charge be in a range of 10 ppm to 1% by weight on an average. Further, unless the concentration is higher than 30 ppm or smaller than 5000 ppm on an average even when it falls within the above defined range, the polarity inversion phenomenon remains partially unimproved. Thus, for attaining more satisfactory improvement of the after image characteristic, it is more preferable that the concentration on an average lies within a range between 30 ppm and 5000 ppm by weight.

In the foregoing description, it has been assumed that the invention is applied to a target of an image pickup tube. However, it goes without saying that the invention can be equally applied to the photoconductive layers for photoelectric elements, light sensitive members of electrophotography and the like.

We claim:

1. A photoconductive film comprising a photoconductive layer which is mainly made of selenium, said layer having a region added with tellurium located in a direction of the thickness of the layer, wherein at least one of said tellurium added region and another region located adjacent in a direction of hole flow to said tellurium added region is doped with at least one member selected from the group consisting of an oxide, a fluoride and elements belonging to one of the groups II, III and VII of the Periodic Table, which are capable of forming negative space charge in selenium, and wherein said at least one member is doped to at least a portion located in the hole flow direction of said tellurium added region when it is doped thereto, and at least a portion of said another region when it is doped thereto, at a concentration in a range of 10 ppm to 1% by weight on an average.

2. A photoconductive film according to claim 1, wherein said concentration is in a range between 30 ppm and 5000 ppm by weight on an average.

3. A photoconductive film according to claim 1, wherein said oxide includes at least one selected from a group consisting of CuO, $In_2O_3$, $SeO_2$, $V_2O_5$, $MoO_3$ and $WO_3$, said fluoride includes at least one of $GaF_3$ and $InF_3$, and said at least one element is selected from the group consisting of Zn, Ga, In, Cl, I and Br.

4. A photoconductive layer according to claim 1, wherein at least the another region which is located adjacent to the region added with tellurium and which has a thickness in a range of 50 Å to 5000 Å is provided, with at least one element selected from a group consisting of As, Bi, Sb, Ge and Si, at a concentration in a range of 1% to 30% by weight on an average.

5. A photoconductive film according to claim 1, wherein at least a portion of a region which absorbs incident light to create a major portion of signal current is doped, with at least one component selected from a group consisting of LiF, $MgF_2$, $CaF_2$, $AlF_3$, $CrF_3$, $MnF_2$, $CoF_2$, $PbF_2$, $BaF_2$, $CeF_3$ and TlF, at a concentration in a range of 50 ppm to 5% by weight on an average.

6. A photoconductive film according to claim 3, wherein at least the another region which is located adjacent to the region added with tellurium and which has a thickness in a range of 50 Å to 5000 Å is added provided with at least one element selected from a group consisting of As, Bi, Sb, Ge and Si, at a concentration in a range of 1% to 30% by weight on an average.

7. A photoconductive film according to claim 3, wherein at least a portion of a region which absorbs incident light to create a major portion of signal current is doped, with at least one component selected from a group consisting of LiF, $MgF_2$, $CaF_2$, $AlF_3$, $CrF_3$, $MnF_2$, $CoF_2$, $PbF_2$, $BaF_2$, $CeF_3$ and TlF, at a concentration in a range of 50 ppm to 5% by weight on an average.

8. A photoconductive film including a sensitized layer which is mainly made of selenium, said sensitized layer including first, second and third regions contiguously arranged in that order in a direction of hole flow in the layer, said second region being added with tellunium, wherein at least one of said second and third regions is doped at least at a portion with at least one member selected from the group consisting of an oxide, a fluoride and elements belonging to the group II, II and VII of the Periodic Table, which are capable of forming negative space charge in selenium, and wherein said at least one member is doped to at least a portion of said second region close to said third region, when it is doped to said second region.

9. A photoconductive layer according to claim 8, wherein said second region is doped with said at least one member at a concentration in a range of 10 ppm to 1% by weight on an average.

10. A photoconductive layer according to claim 4, wherein said at least one element selected from the group consisting of As, Bi, Ge and Si is uniformly distributed in said at least the region.

11. A photoconductive layer according to claim 4, wherein said at least one element selected from the group consisting of As, Bi, Ge and Si is distributed so as to be gradually reduced from a concentration of 25% at maximum in the hole flow direction.

12. A photoconductive layer according to claim 1, wherein said another region is uniformly doped with said at least one member.

13. A photoconductive layer according to claim 1, wherein only a portion of said another region is doped with said at least one member.

14. A photoconductive layer according to claim 1, wherein said another region is doped at a portion with said at least one member and simultaneously added with As distributed stepwise.

15. A photoconductive layer according to claim 1, wherein said another region is doped with said at least one member and simultaneously added with As distributed stepwise.

* * * * *